(12) United States Patent
Maeda et al.

(10) Patent No.: US 11,776,953 B2
(45) Date of Patent: Oct. 3, 2023

(54) BIMOS SEMICONDUCTOR DEVICE

(71) Applicant: HONDA MOTOR CO., LTD., Tokyo (JP)

(72) Inventors: Yasuhiro Maeda, Saitama (JP); Yoshinari Tsukada, Saitama (JP); Shinya Maita, Saitama (JP); Genki Nakamura, Saitama (JP); Yuki Negoro, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 33 days.

(21) Appl. No.: 17/670,534

(22) Filed: Feb. 14, 2022

(65) Prior Publication Data

US 2022/0319927 A1 Oct. 6, 2022

(30) Foreign Application Priority Data

Mar. 31, 2021 (JP) ................. 2021-062237

(51) Int. Cl.
*H01L 27/06* (2006.01)
*H01L 21/8249* (2006.01)
*H01L 29/78* (2006.01)

(52) U.S. Cl.
CPC ...... *H01L 27/0623* (2013.01); *H01L 21/8249* (2013.01); *H01L 29/7813* (2013.01)

(58) Field of Classification Search
CPC ............ H01L 21/8249; H01L 27/0623; H01L 29/7813; H01L 27/0705; H01L 29/0649; H01L 29/0653; H01L 29/0634; H01L 29/7397; H01L 29/0603; H01L 29/0684
See application file for complete search history.

(56) References Cited

U.S. PATENT DOCUMENTS

| | | | |
|---|---|---|---|
| 4,941,030 A | 7/1990 | Majumdar | |
| 2007/0181927 A1* | 8/2007 | Yedinak | H01L 29/0834 |
| | | | 257/E29.066 |
| 2017/0047319 A1* | 2/2017 | Naito | H01L 29/868 |
| 2017/0221989 A1* | 8/2017 | Hirler | H01L 29/0696 |
| 2020/0152748 A1 | 5/2020 | Okumura | |
| 2020/0235203 A1* | 7/2020 | Furuhashi | H01L 29/7397 |

FOREIGN PATENT DOCUMENTS

| | | |
|---|---|---|
| JP | S60196974 A | 10/1985 |
| JP | S61180472 A | 8/1986 |
| JP | S61225854 A | 10/1986 |
| JP | 2015039010 A | 2/2015 |
| JP | 2020077800 A | 5/2020 |
| WO | 2019069416 A1 | 4/2019 |

* cited by examiner

*Primary Examiner* — Shouxiang Hu
(74) *Attorney, Agent, or Firm* — CKC & Partners Co., LLC

(57) ABSTRACT

Provided is an n-channel BiMOS semiconductor device having a trench gate structure, the n-channel BiMOS semiconductor device including: an $n^+$ drain layer; a parallel pn layer including $n^-$ drift and p pillar layers joined alternately; a composite layer including a p base layer and an $n^+$ source layer, the $n^+$ drain layer, the parallel pn layer, and the composite layer being provided in order; a high-resistance layer provided between a portion of the p base layer above the p pillar layer and the $n^+$ source layer; and a high-resistance layer provided between the p pillar layer and the p base layer, the p pillar layer having an impurity concentration lower than that of the $n^-$ drift layer.

2 Claims, 13 Drawing Sheets

Prior Art

Prior Art

Prior Art

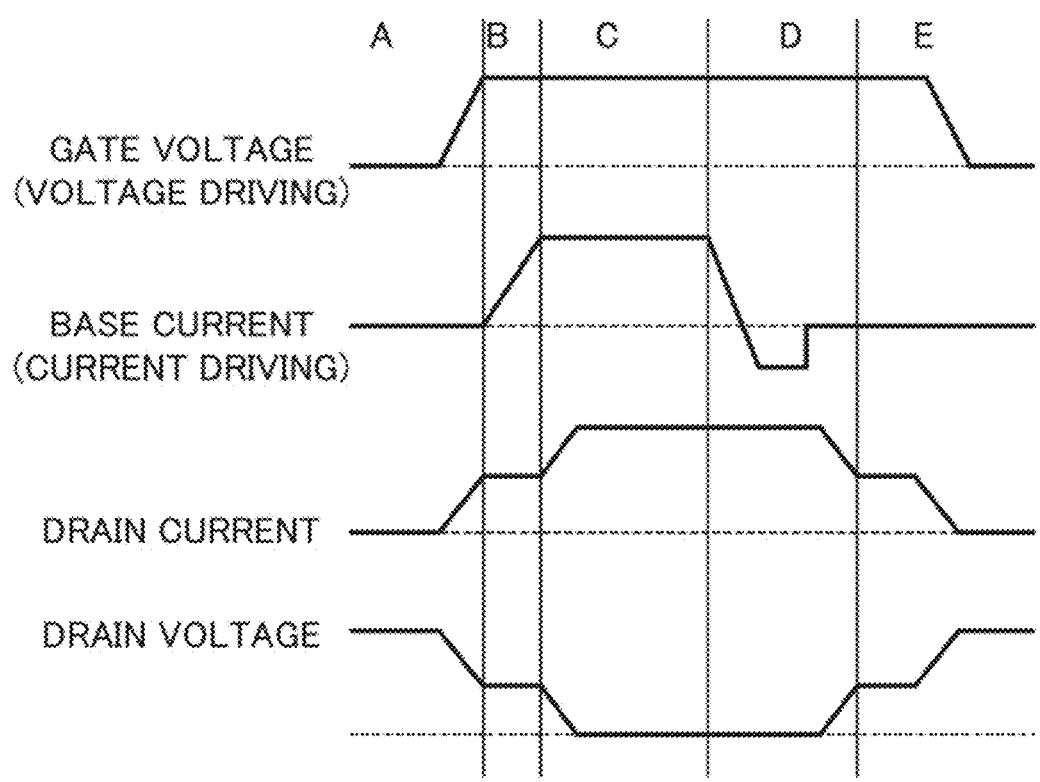

FIG. 13

| INPUT | | A | B | C | D | E |
|---|---|---|---|---|---|---|
| I | GATE VOLTAGE | L→H | H | H | H | H→L |
| | BASE CURRENT | L | L→H | H | H→L | L |
| II | GATE VOLTAGE | L→H | H | H | H | H→L |
| | BASE CURRENT | L→H | H | H | H→L | L |
| III | GATE VOLTAGE | L→H | H | H | H | H→L |
| | BASE CURRENT | L | L→H | H | H | H→L |
| IV | GATE VOLTAGE | L→H | H | H | H | H→L |
| | BASE CURRENT | L→H | H | H | H | H→L |
| V | GATE VOLTAGE | L→H | L→H | H | H→L | L |
| | BASE CURRENT | L→H | H | H | H→L | L |
| VI | GATE VOLTAGE | L | L→H | H | H→L | L |
| | BASE CURRENT | L | L→H | H | H | H→L |
| VII | GATE VOLTAGE | L | L→H | H | H→L | L |
| | BASE CURRENT | L→H | H | H | H | H→L |
| VIII | GATE VOLTAGE | L | L→H | H | H | H→L |
| | BASE CURRENT | L→H | H | H | H→L | L |
| IX | GATE VOLTAGE | L | L→H | H | H→L | L |
| | BASE CURRENT | - | - | - | - | - |
| X | GATE VOLTAGE | - | - | - | - | - |
| | BASE CURRENT | L | L→H | H | H→L | L |

BIMOS SEMICONDUCTOR DEVICE

This application is based on and claims the benefit of priority from Japanese Patent Application No. 2021-062237, filed on 31 Mar. 2021, the content of which is incorporated herein by reference.

BACKGROUND OF THE INVENTION

Field of the Invention

The present invention relates to a BiMOS semiconductor device.

Related Art

A BiMOS semiconductor device is known to include a bipolar transistor and a metal oxide-semiconductor field-effect transistor (MOSFET) connected in parallel on a single chip (see, for example, Patent Documents 1 and 2).

An insulated gate bipolar transistor (IGBT) is also known to be a semiconductor device including a bipolar transistor and a MOSFET combined on a single chip (see, for example, Patent Document 3).

In such a device, the MOSFET has a vertical structure for high voltage resistance and large current capacity. The vertical structure also has a trench gate structure for cell miniaturization and low on-resistance.

Patent Document 1: Japanese Unexamined Patent Application, Publication No. S61-180472

Patent Document 2: Japanese Unexamined Patent Application, Publication No. S61-225854

Patent Document 3: Japanese Unexamined Patent Application, Publication No. S60-196974

SUMMARY OF THE INVENTION

FIG. 1 shows a conventional n-channel BiMOS semiconductor device having a trench gate structure.

The BiMOS semiconductor device 10 includes a collector/drain electrode 11, and an $n^+$ drain layer 12, an $n^-$ drift layer 13, and a composite layer 14 including a p base layer 14a and an $n^+$ source layer 14b, which are provided in order on the collector/drain electrode 11. The BiMOS semiconductor device 10 has a trench 15, which extends from the surface of the composite layer 14 to a top portion of the $n^-$ drift layer 13, and further includes a gate insulating film 16 and a gate electrode 17 which is provided inside the trench 15 with the gate insulating film 16 disposed between the gate electrode 17 and the wall of the trench 15. In this structure, the $n^+$ source layer 14b is provided in an upper portion of the composite layer 14 and on each of the two sides of the trench 15. The BiMOS semiconductor device 10 further includes an emitter/source electrode 18 on the $n^+$ source layer 14b and includes a base electrode 19 that is spaced apart by a given distance from the emitter/source electrode 18 and provided on an $n^+$ source layer 14b-free region of the composite layer 14.

In FIG. 1, a half cell is indicated by broken lines. Such a half cell is shown in FIG. 2 and other drawings for illustrating the BiMOS semiconductor device.

Next, how the BiMOS semiconductor device 10 operates will be explained with reference to FIG. 2. It should be noted that in FIG. 2, the thick lines representing electron and hall currents indicate that the currents are large while the thin lines representing electron and hall currents indicate that the currents are small.

As shown in FIG. 2, an inversion layer 14c is generated in a portion of the p base layer 14a in the vicinity of the gate electrode 17 when a gate voltage positive with respect to the emitter/source electrode 18 is applied to the gate electrode 17 while a voltage positive with respect to the emitter/source electrode 18 is applied to the collector/drain electrode 11. In this state, an electron current 21a flows from the collector/drain electrode 11 to the emitter/source electrode 18 through the $n^+$ drain layer 12, the $n^-$ drift layer 13, the inversion layer 14c, and the $n^+$ source layer 14b. When a base current is allowed to flow to the base electrode 19 while a voltage positive with respect to the emitter/source electrode 18 is applied to the collector/drain electrode 11, electron currents 21b and 21c flow and an electron current 21d flows from the collector/drain electrode 11 to the emitter/source electrode 18 through the $n^+$ drain layer 12, the $n^-$ drift layer 13, the p base layer 14a, and the $n^+$ source layer 14b. A hall current 22 also flows from the p base layer 14a to the $n^-$ drift layer 13. In this state, the electron currents 21b and 21c flow into the $n^+$ source layer 14b from the lateral and lower sides, respectively.

Unfortunately, the BiMOS semiconductor device 10 has a problem in that, for the purpose of high voltage resistance, the $n^-$ drift layer 13 cannot have a high impurity concentration and thus a low current density is provided, because the depletion layer extending in the $n^-$ drift layer 13 has the highest field intensity at the interface with the p base layer 14a.

FIG. 3 shows a conventional n-channel IGBT having a trench gate structure.

The IGBT 10A includes a collector electrode 11, and a $p^+$ collector layer 12A, an $n^+$ collector layer 12, an $n^-$ drift layer 13, and a composite layer 14 including a p emitter layer 14a and an $n^+$ emitter layer 14b, which are provided in order on the collector electrode 11. The IGBT 10A has a trench 15, which extends from the surface of the composite layer 14 to a top portion of the $n^-$ drift layer 13, and further includes a gate insulating film 16 and a gate electrode 17 which is provided inside the trench 15 with the gate insulating film 16 disposed between the gate electrode 17 and the wall of the trench 15. In this structure, the $n^+$ emitter layer 14b is provided on each of the two sides of the trench 15 at an upper portion of the composite layer 14. The IGBT 10A further includes an emitter electrode 18A on the top of the composite layer 14.

Unfortunately, the IGBT 10A has a problem in that a built-in voltage of about 0.6 V may increase the on-voltage.

It is an object of the present invention to provide a BiMOS semiconductor device having an improved current density.

An aspect of the present invention is directed to an n-channel BiMOS semiconductor device having a trench gate structure, the n-channel BiMOS semiconductor device including: an $n^+$ drain layer; a parallel pn layer including $n^-$ drift and p pillar layers joined alternately; a composite layer including a p base layer and an $n^+$ source layer, the $n^+$ drain layer, the parallel pn layer, and the composite layer being provided in order; a high-resistance layer provided between a portion of the p base layer above the p pillar layer and the $n^+$ source layer; and a high-resistance layer provided between the p pillar layer and the p base layer, the p pillar layer having an impurity concentration lower than that of the $n^-$ drift layer.

Another aspect of the present invention is directed to a p-channel BiMOS semiconductor device having a trench p-channel BiMOS semiconductor device having a trench gate structure, the p-channel BiMOS semiconductor device including: a $p^+$ drain layer; a parallel pn layer including $p^-$ drift and n pillar layers joined alternately; a composite layer including an n base layer and a p⁺ source layer, the p⁺ drain layer, the parallel pn layer, and the composite layer being provided in order; a high-resistance layer provided between a portion of the n base layer above the n pillar layer and the p⁺ source layer; and a high-resistance layer provided between the n pillar layer and the n base layer, the n pillar layer having an impurity concentration lower than that of the p⁻ drift layer.

The present invention makes it possible to provide a BiMOS semiconductor device having an improved current density.

BRIEF DESCRIPTION OF THE DRAWINGS

FIG. 12 is a timing chart for illustrating an exemplary way to operate the MOSFET part and the bipolar transistor part independently in the BiMOS semiconductor device of FIG. 4;

FIG. 13 is a view for illustrating other exemplary ways to operate the MOSFET part and the bipolar transistor part independently in the BiMOS semiconductor device of FIG. 4.

DETAILED DESCRIPTION OF THE INVENTION

Hereinafter, embodiments of the present invention will be described with reference to the drawings.

Figure 4:
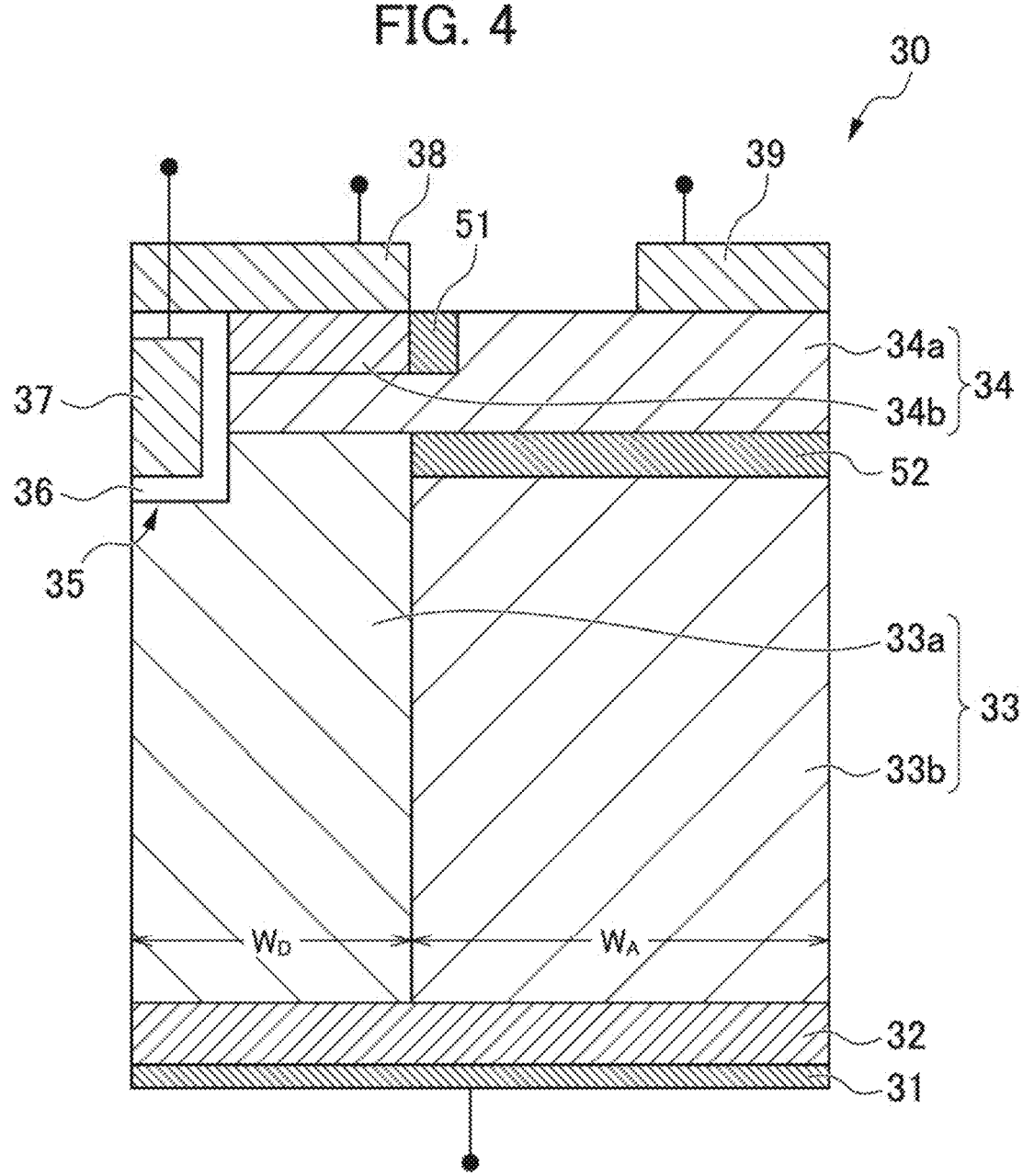
FIG. 4 is a cross-sectional view showing an example of a BiMOS semiconductor device according to an embodiment of the present invention.

FIG. 4 shows an exemplary BiMOS semiconductor device according to an embodiment of the present invention.

The BiMOS semiconductor device 30 is an n-channel BiMOS semiconductor device having a trench gate structure.

The BiMOS semiconductor device 30 includes a collector/drain electrode 31, an n⁺ drain layer 32, a parallel pn layer 33 including an n⁻ drift layer 33a and a p pillar layer 33b joined alternately, and a composite layer 34 including a p base layer 34a and an n⁺ source layer 34b, in which the n⁺ drain layer 32, the parallel pn layer 33, and the composite layer 34 are provided in order on the collector/drain electrode 31. The BiMOS semiconductor device 30 has a trench 35 extending from the surface of the composite layer 34 to a top portion of the parallel pn layer 33, and further includes a gate insulating film 36 and a gate electrode 37 that is provided inside the trench 35 with the gate insulating film 36 disposed between the gate electrode 37 and the wall of the trench 35. In this structure, the n⁺ source layer 34b is provided in an upper portion of the composite layer 34 and on each of the two sides of the trench 35 and provided above the n⁻ drift layer 33a. The BiMOS semiconductor device 30 further includes an emitter/source electrode 38 on the n⁺ source layer 34b and includes a base electrode 39 that is spaced apart by a given distance from the emitter/source electrode 38 and provided on an n⁺ source layer 34b-free region of the composite layer 34.

In the BiMOS semiconductor device 30, the parallel pn layer 33 allows the depletion layer extending in the n⁻ drift layer 33a to have an almost uniform field intensity in the thickness direction and thus allows the n⁻ drift layer 33a to have a high impurity concentration, which allows the BiMOS semiconductor device 30 to have an improved current density.

The BiMOS semiconductor device 30 further includes a high-resistance layer 51 provided between a portion of the p base layer 34a above the p pillar layer 33b and the n⁺ source layer 34b. The high-resistance layer 51 can reduce the electron current flowing from the lateral side to the n⁺ source layer 34b when the base current is allowed to flow to the base electrode 39, which allows the BiMOS semiconductor device 30 to have an improved current density.

The BiMOS semiconductor device 30 further includes a high-resistance layer 52 provided between the p pillar layer 33b and the p base layer 34a. The high-resistance layer 52 can reduce the electron current flowing from the p base layer 34a to the n⁻ drift layer 33a through the p pillar layer 33b, which allows the BiMOS semiconductor device 30 to have an improved current density.

The high-resistance layers 51 and 52 may be made of $SiO_2$ as a non-limiting example. The high-resistance layers 51 and 52 are a mode for increasing the resistance of the interlayer portion. Alternatively, high-resistance films may be used in place of the $SiO_2$ films or other insulating films. Other methods for increasing the resistance of the interlayer portion may be, but not limited to, spatial isolation between the layers.

In this case, the impurity concentration $N_D$ of the n⁻ drift layer 33a and the impurity concentration $N_A$ of the p pillar layer 33b satisfy the formula:

$$N_A < N_D,$$

This lowers the potential barrier at the interface between the n⁻ drift layer 33a and the p pillar layer 33b and thus allows the electron current to easily flow from the n⁻ drift layer 33a to the p pillar layer 33b.

The width $W_D$ of the n⁻ drift layer 33a and the width $W_A$ of the p pillar layer 33b also satisfy the formula:

$$W_D < W_A$$

In this case, $W_A$ may be adjusted as appropriate in view of voltage resistance.

The substrate material for the BiMOS semiconductor device 30 is typically, but not limited to, Si, SiC, GaN, Ga$_2$O$_3$, or any other semiconductor material. The impurities may be a known acceptor and a known donor.

Next, how the BiMOS semiconductor device 30 operates will be explained with reference to FIG. 5. It should be noted that in FIG. 5, the thick lines representing electron and hall currents indicate that the currents are large while the thin lines representing electron and hall currents indicate that the currents are small.

Figure 5:
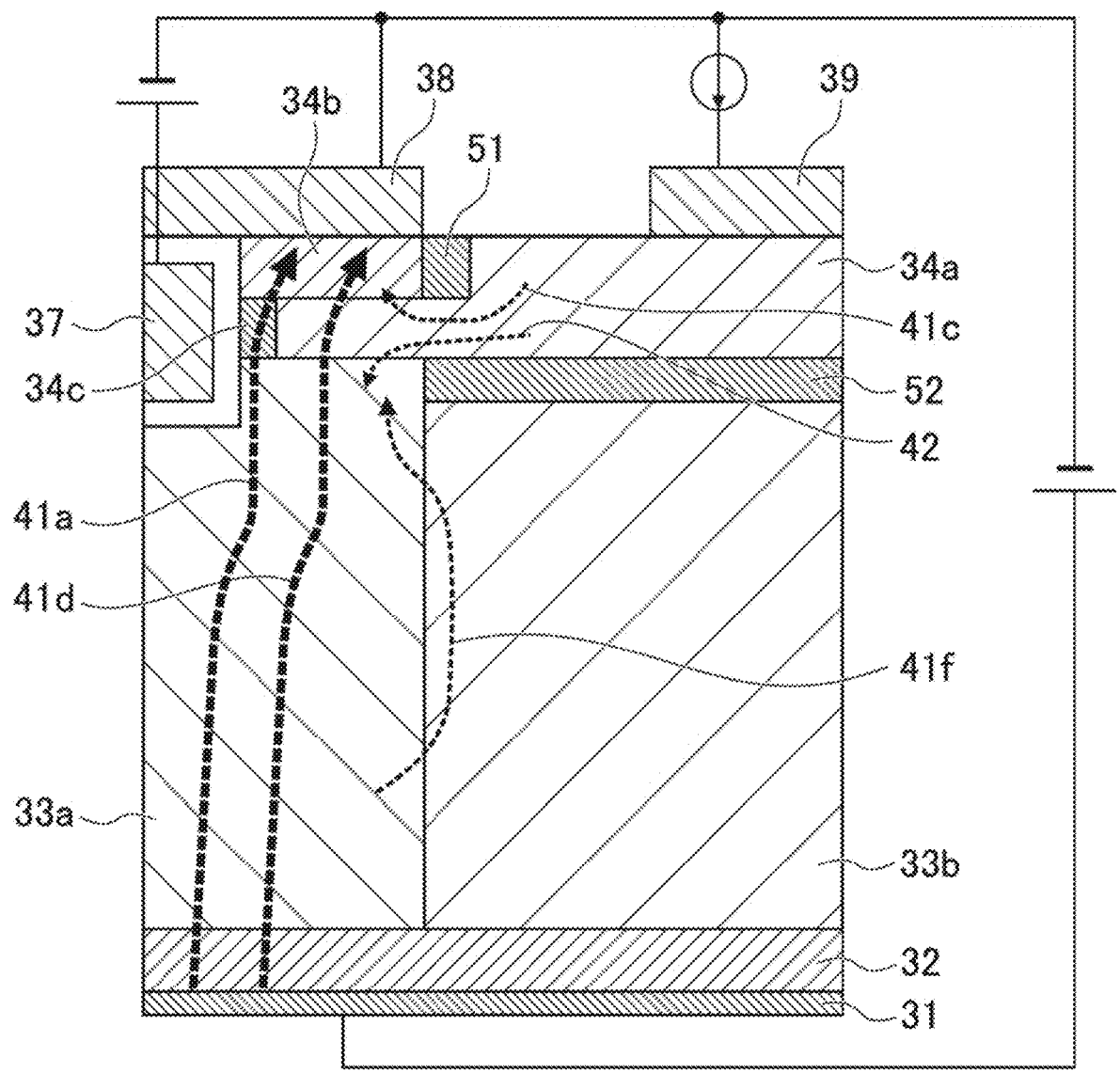
FIG. 5 is a view for illustrating how the BiMOS semiconductor device of FIG. 4 operates.

As shown in FIG. 5, an inversion layer 34c is generated in a portion of the p base layer 34a in the vicinity of the gate electrode 37 when a gate voltage positive with respect to the emitter/source electrode 38 is applied to the gate electrode 37 while a voltage positive with respect to the emitter/source electrode 38 is applied to the collector/drain electrode 31. In this state, an electron current 41a flows from the collector/drain electrode 31 to the emitter/source electrode 38 through the n$^+$ drain layer 32, the n$^-$ drift layer 33a, the inversion layer 34c, and the n$^+$ source layer 34b.

When a base current is allowed to flow to the base electrode 39 while a voltage positive with respect to the emitter/source electrode 38 is applied to the collector/drain electrode 31, an electron current 41c flows from the p base layer 34a to the n$^+$ source layer 34b. An electron current 41d also flows from the collector/drain electrode 31 to the emitter/source electrode 38 through the n$^+$ drain layer 32, the n$^-$ drift layer 33a, the p base layer 34a, and the n$^+$ source layer 34b. A hall current 42 also flows from the p base layer 34a to the n$^-$ drift layer 33a. In this case, the electron current 41c flows into the n$^+$ source layer 34b from the lower side.

In this case, since the potential barrier is low at the interface between the n-drift layer 33a and the p pillar layer 33b, an electron current 41f flows from a part of the n$^-$ drift layer 33a to another part of the n$^-$ drift layer 33a through the p pillar layer 33b.

Figure 1:
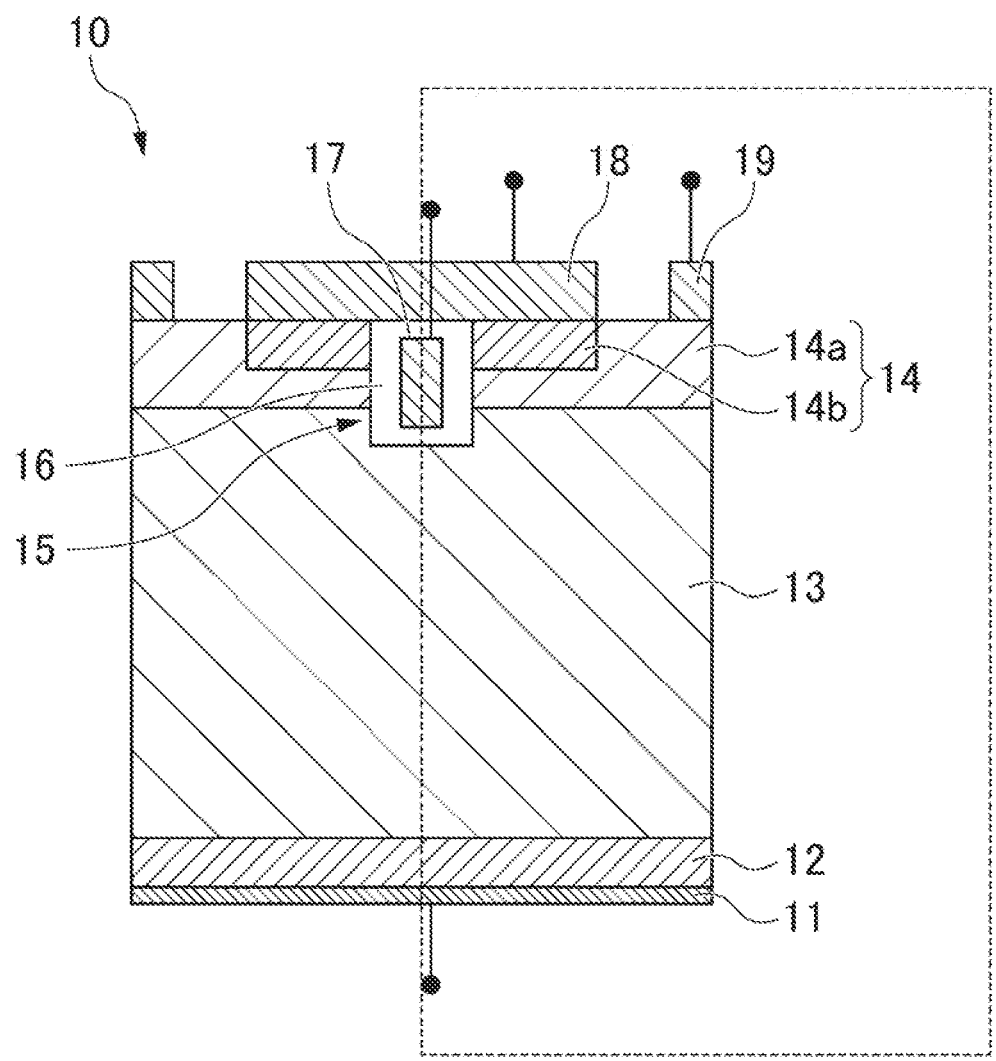
FIG. 1 is a cross-sectional view showing a conventional n-channel BiMOS semiconductor device having a trench gate structure.
Figure 2:
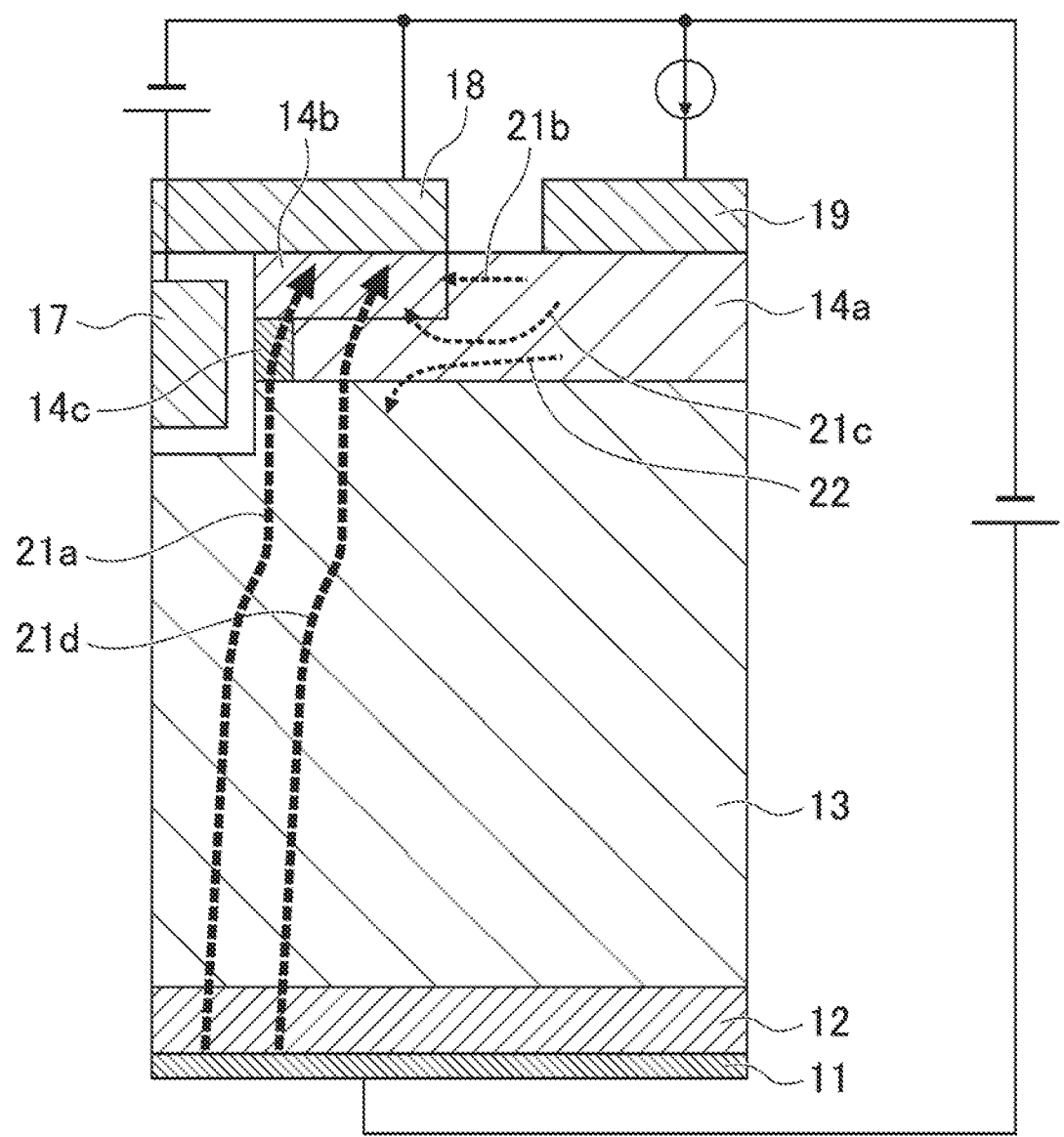
FIG. 2 is a view for illustrating how the BiMOS semiconductor device of FIG. 1 operates.
Figure 3:
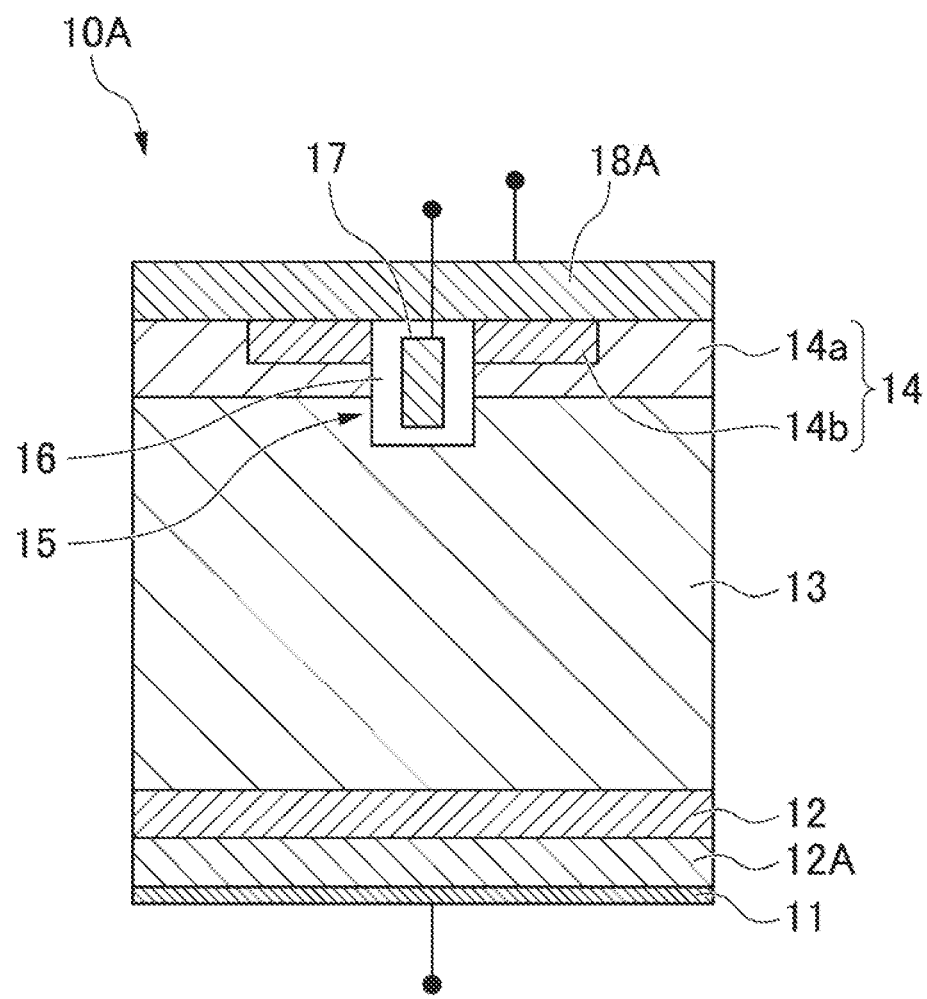
FIG. 3 is a cross-sectional view showing a conventional n-channel IGBT having a trench gate structure.
Figure 6:
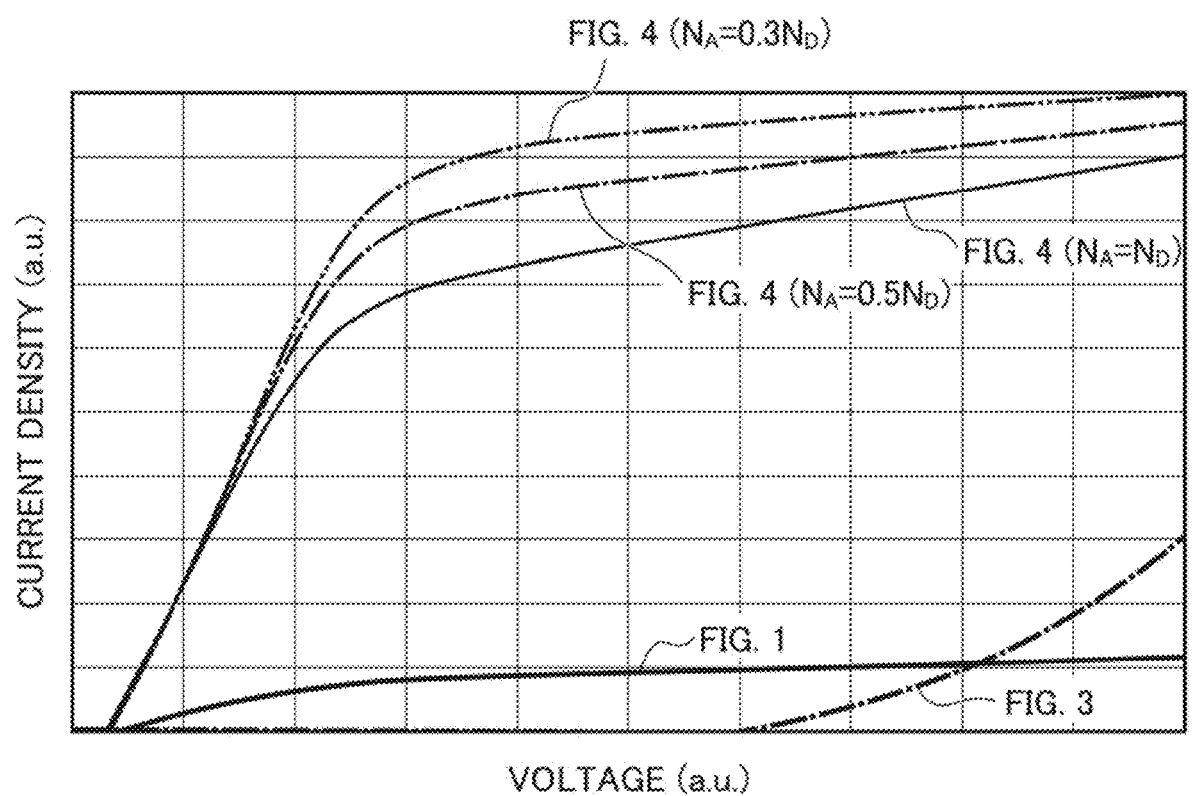
FIG. 6 is a graph showing the results of simulation of the I-V curves of the BiMOS semiconductor devices of FIGS. 1 and 4 and the IGBT of FIG. 3.

FIG. 6 shows the results of simulation of the I-V curves of the BiMOS semiconductor devices 10 and 30 (see FIGS. 1 and 4) and the IGBT 10A (see FIG. 3).

FIG. 6 indicates that the BiMOS semiconductor device 30 has a current density higher than that of the BiMOS semiconductor device 10 or the IGBT 10A. It is also apparent that the BiMOS semiconductor device 30 has a higher current density when N$_A$ equals 0.3N$_D$ or 0.5N$_D$ (N$_A$=0.3N$_D$ or 0.5N$_D$) than when N$_A$ equals N$_D$ (N$_A$=N$_D$).

In FIG. 6, the I-V curves are the results of the simulation, in which the voltage is applied to the collector/drain electrode 31, and the current density is the density of the current flowing to the collector/drain electrode 31.

Figure 7:
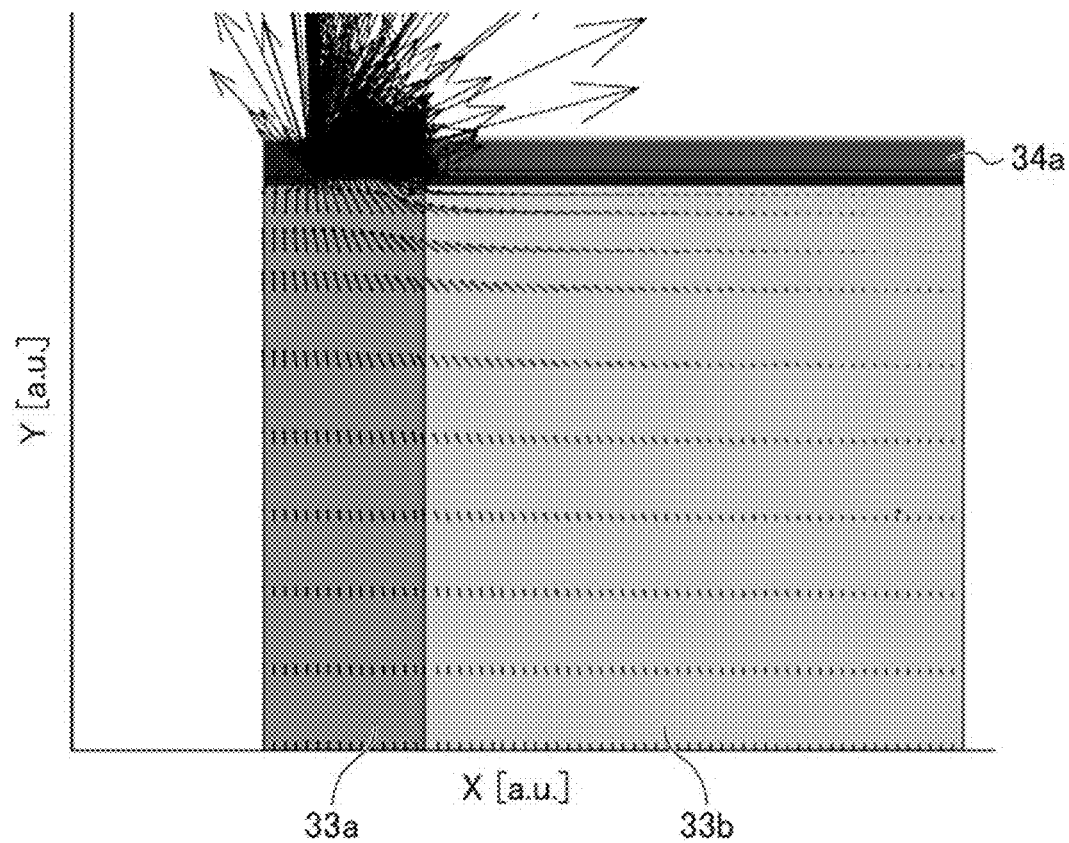
FIG. 7 is a view showing the results of simulation of electron current vectors in the BiMOS semiconductor device ($N_A$=0.3$N_D$) of FIG. 4.

FIG. 7 shows the results of simulation of the electron current vectors in the BiMOS semiconductor device (N$_A$=0.3N$_D$) of FIG. 4.

As shown in FIG. 7, the electron current 41f (see FIG. 5) flows in the p pillar layer 33b and then flows into the n-drift layer 33a.

In this case, the lower the potential barrier at the interface between the n$^-$ drift layer 33a and the p pillar layer 33b, the more easily the electron current 41f flows into the p pillar layer 33b from the n$^-$ drift layer 33a. The potential barrier Φ$_B$ is expressed by the equation below. The Φ$_B$ decreases with decreasing N$_A$.

$$\Phi_B = \frac{k_B T}{q} \log\left(\frac{N_A N_D}{n_i^2}\right) \quad \text{[Math. 1]}$$

In the equation, k$_B$ is Boltzmann constant, T is absolute temperature, q is elementary charge, N$_A$ is the impurity concentration of the p pillar layer 33b, N$_D$ is the impurity concentration of the n$^-$ drift layer 33a, and n$_i$ is intrinsic carrier concentration.

Figure 8:
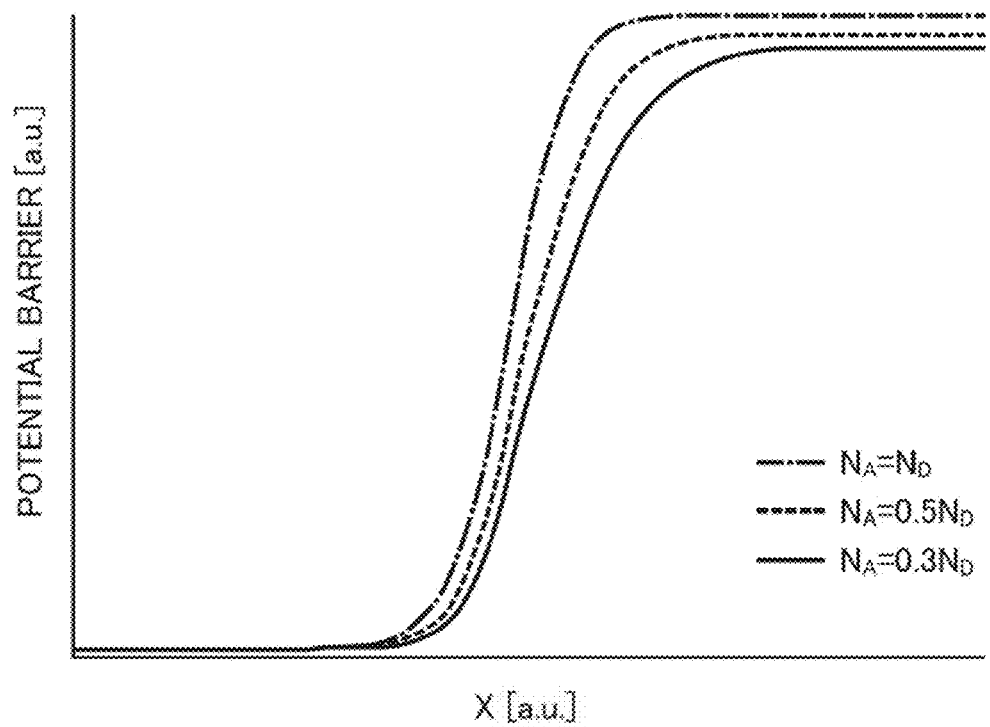
FIG. 8 is a graph showing the results of simulation of the potential barrier at the A-A' cross-section in FIG. 7.

FIG. 8 shows the results of simulation of the potential barrier at the A-A' cross-section in FIG. 7.

FIG. 8 indicates that the potential barrier at the interface between the n$^-$ drift layer 33a and the p pillar layer 33b is lower when N$_A$ equals 0.3N$_D$ or 0.5N$_D$ (N$_A$=0.3N$_D$ or 0.5N$_D$) than when N$_A$ equals N$_D$ (N$_A$=N$_D$).

Figure 9:
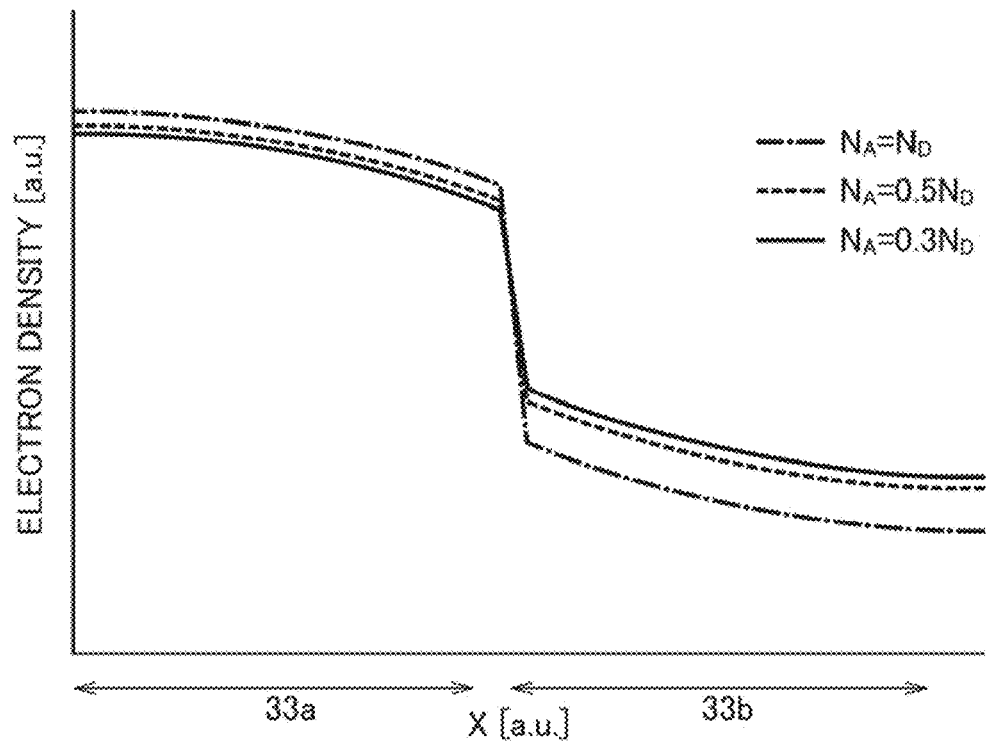
FIG. 9 is a graph showing the results of simulation of the electron density at the A-A' cross-section in FIG. 7.

FIG. 9 shows the results of simulation of the electron density at the A-A' cross-section in FIG. 7.

FIG. 9 indicates that the electron density at the interface between the n$^-$ drift layer 33a and the p pillar layer 33b is higher when N$_A$ equals 0.3N$_D$ or 0.5N$_D$ (N$_A$=0.3N$_D$ or 0.5N$_D$) than when N$_A$ equals N$_D$(N$_A$=N$_D$).

Accordingly, when N$_A$=0.3N$_D$ or 0.5N$_D$, the potential barrier at the interface between the n$^-$ drift layer 33a and the p pillar layer 33b in the BiMOS semiconductor device 30 is lower and the electron current 41f more easily flows into the p pillar layer 33b than when N$_A$=N$_D$, and the p pillar layer 33b is more effectively utilized as a route for the electron current 41f.

Figure 10:
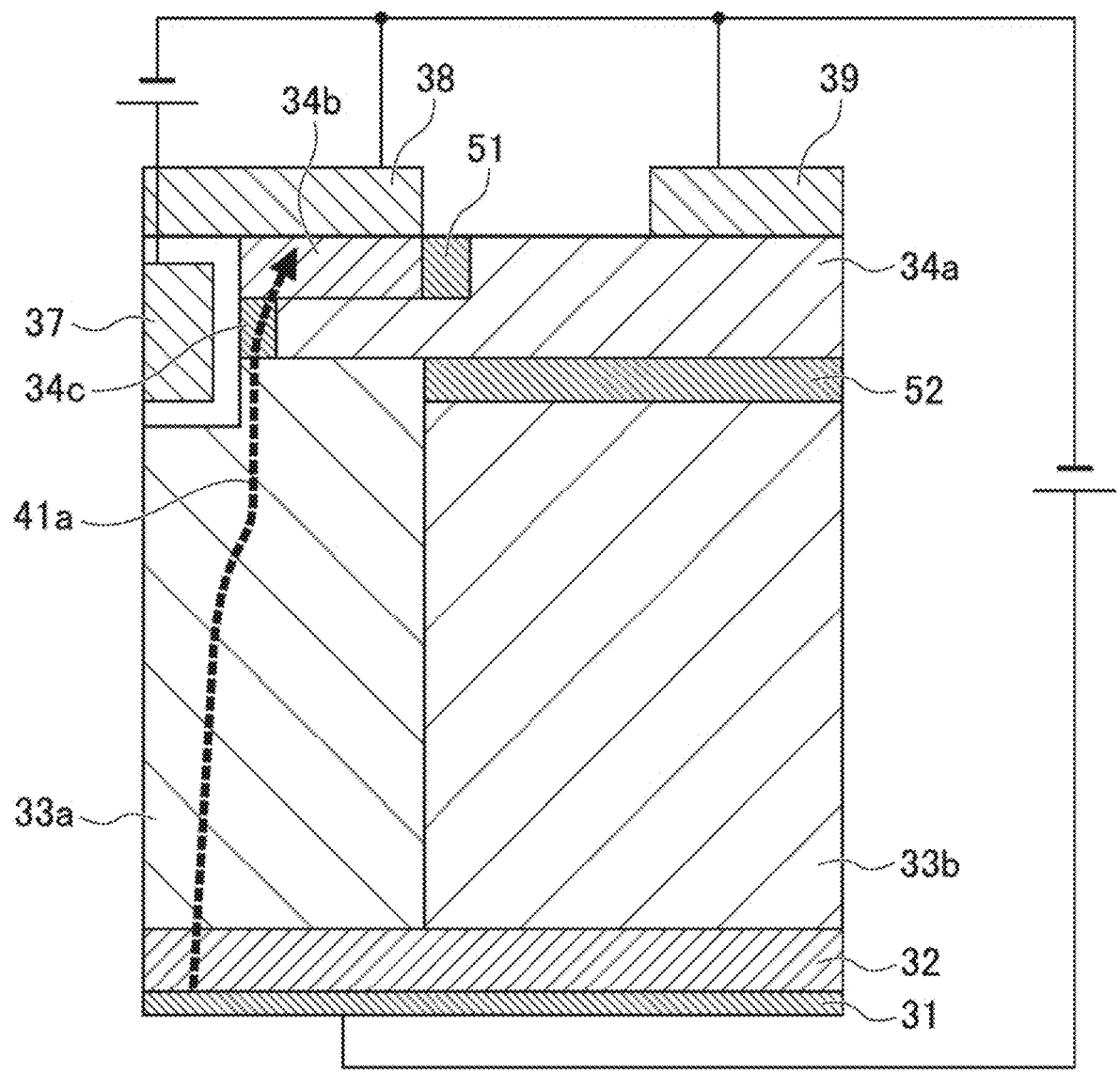
FIG. 10 is a view for illustrating a complementary method for operating only the MOSFET part in the BiMOS semiconductor device of FIG. 4.
Figure 11:
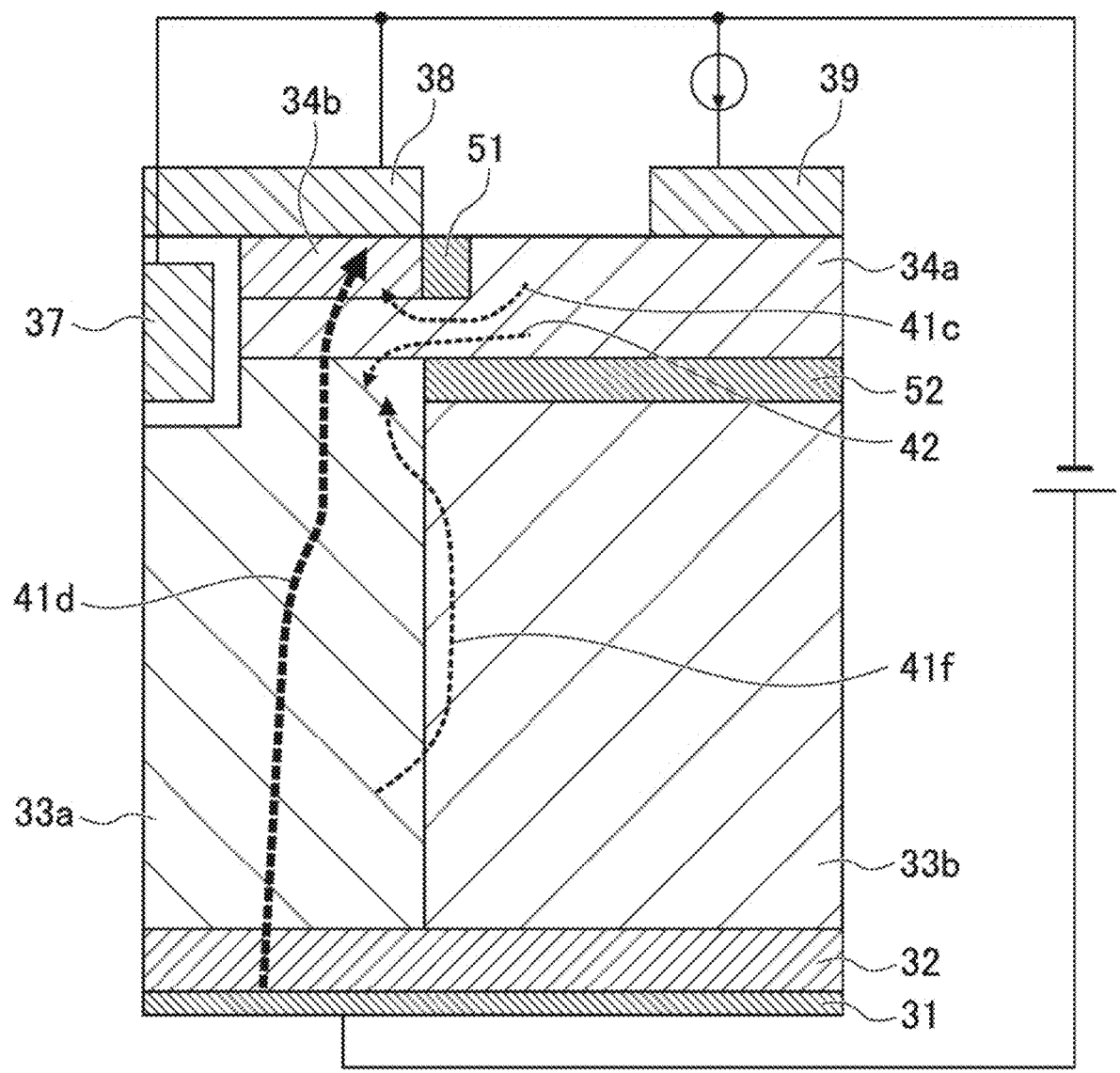
FIG. 11 is a view for illustrating a complementary method for operating only the bipolar transistor part in the BiMOS semiconductor device of FIG. 4.

In the BiMOS semiconductor device 30, only the MOSFET part can be operated by voltage-only driving (see FIG. 10), and only the bipolar transistor part can be operated by current-only driving (see FIG. 11).

FIG. 12 shows an exemplary way to operate the MOSFET part and the bipolar transistor part independently in the BiMOS semiconductor device 30.

First, at timing A, the gate voltage is switched from Low (L) to High (H) to turn on the MOSFET so that the drain current increases while the drain voltage decreases. Next, at timing B, the base current is switched from L to H to turn on the bipolar transistor, so that at timing C, the drain current increases while the drain voltage decreases. Next, at timing D, the base current is switched from H to L to turn off the bipolar transistor, so that after the elapse of a given period of time, the drain current decreases while the drain voltage increase. Next, at timing E, the gate voltage is switched from H to L to turn off the MOSFET so that the drain current decreases while the drain voltage increases, which results in return to the initial state.

In this case, the bipolar transistor has secondary breakdown limitation in the safe operating area. It is preferred therefore that as shown in FIG. 12, turning off the bipolar transistor should be followed by turning off the MOSFET taking into account bipolar transistor operation delay.

FIG. 13 shows other exemplary ways to operate the MOSFET part and the bipolar transistor part independently in the BiMOS semiconductor device 30. In FIG. 13, I represents the method shown in FIG. 12.

While the BiMOS semiconductor device according to the embodiment has been described with reference to an n-channel BiMOS semiconductor device, the BiMOS semiconductor device according to the embodiment is not limited to an n-channel type and may also be a p channel type.

Figure 14:
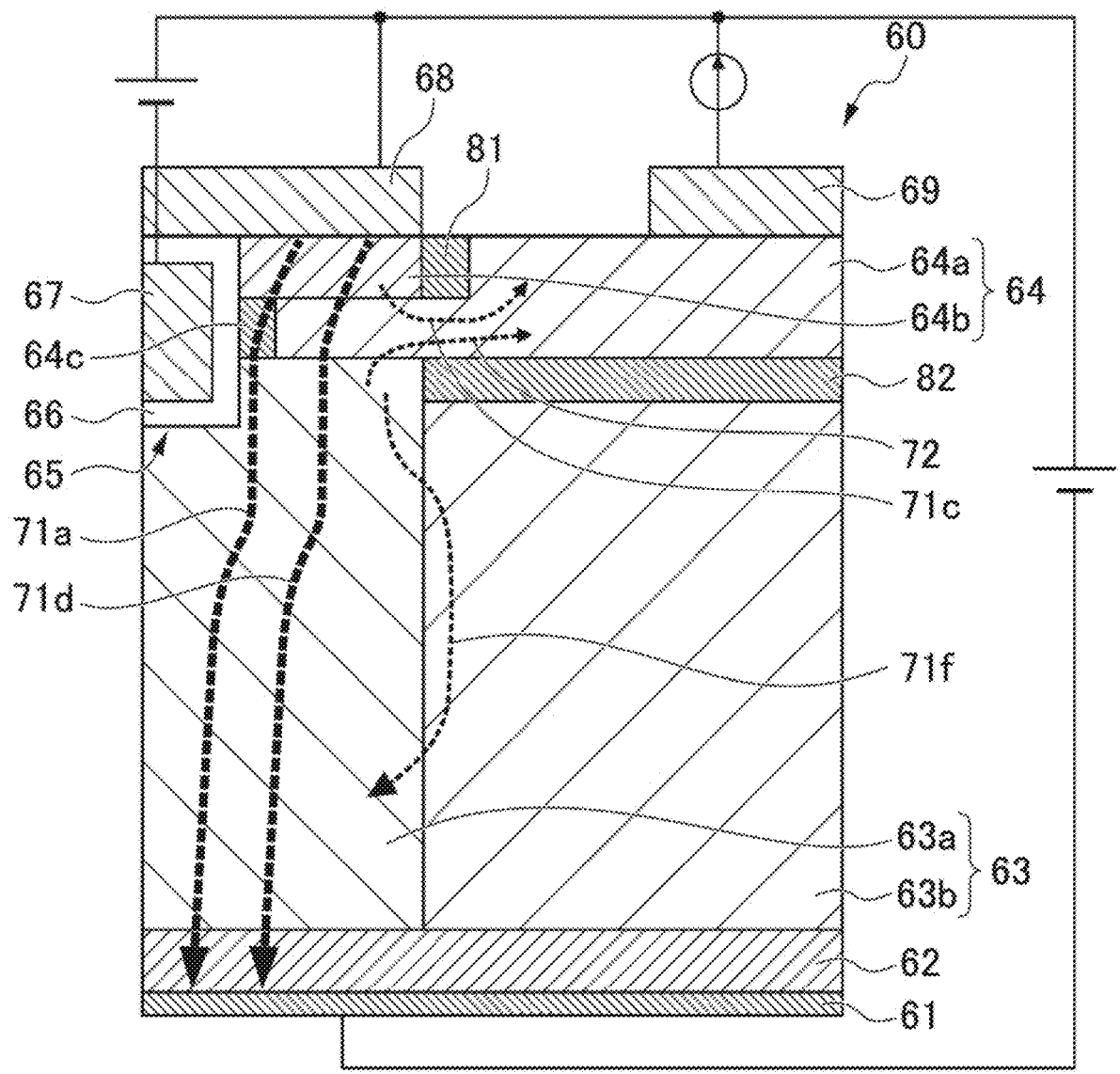
FIG. 14 is a cross-sectional view showing another example of the BiMOS semiconductor device according to the present embodiment.

FIG. 14 shows another exemplary BiMOS semiconductor device according to the embodiment.

The BiMOS semiconductor device 60 is a p-channel BiMOS semiconductor device having a trench gate structure.

The BiMOS semiconductor device 60 includes a collector/drain electrode 61, a p$^+$ drain layer 62, a parallel pn layer 63 including a p$^-$ drift layer 63a and an n pillar layer 63b joined alternately, and a composite layer 64 including an n base layer 64a and a p$^+$ source layer 64b, in which the p$^+$ drain layer 62, the parallel pn layer 63, and the composite layer 64 are provided in order on the collector/drain electrode 61. The BiMOS semiconductor device 60 has a trench 65 extending from the surface of the composite layer 64 to a top portion of the parallel pn layer 63, and further includes a gate insulating film 66 and a gate electrode 67 that is provided inside the trench 65 with the gate insulating film 66 disposed between the gate electrode 67 and the wall of the trench 65. In this structure, the $p^+$ source layer 64b is provided in an upper portion of the composite layer 64 and on each of the two sides of the trench 65 and provided above the $p^-$ drift layer 63a. The BiMOS semiconductor device 60 further includes an emitter/source electrode 68 on the $p^+$ source layer 64b and includes a base electrode 69 that is spaced apart by a given distance from the emitter/source electrode 68 and provided on a $p^+$ source layer 64b-free region of the composite layer 64.

In the BiMOS semiconductor device 60, the parallel pn layer 63 allows the depletion layer extending in the $p^-$ drift layer 63a to have an almost uniform field intensity in the thickness direction and thus allows the $p^-$ drift layer 63a to have a high impurity concentration, which allows the BiMOS semiconductor device 60 to have an improved current density.

The BiMOS semiconductor device 60 further includes a high-resistance layer 81 provided between a portion of the n base layer 64a above the n pillar layer 63b and the $p^+$ source layer 64b. The high-resistance layer 81 can reduce the electron current flowing from the lateral side to the $p^+$ source layer 64b when the base current is allowed to flow to the base electrode 69, which allows the BiMOS semiconductor device 60 to have an improved current density.

The BiMOS semiconductor device 60 further includes a high-resistance layer 82 provided between the n pillar layer 63b and the n base layer 64a. The high-resistance layer 82 can reduce the electron current flowing from the n base layer 64a to the $p^-$ drift layer 63a through the n pillar layer 63b, which allows the BiMOS semiconductor device 60 to have an improved current density.

The high-resistance layers 81 and 82 may be made of $SiO_2$ as a non-limiting example. The high-resistance layers 81 and 82 are a mode for increasing the resistance of the interlayer portion. Alternatively, high-resistance films may be used in place of the $SiO_2$ films or other insulating films. Other methods for increasing the resistance of the interlayer portion may be, but not limited to, spatial isolation between the layers.

In this case, the impurity concentration $N_h$ of the $p^-$ drift layer 63a and the impurity concentration $N_n$ of the n pillar layer 63b satisfy the formula:

$$N_D < N_A$$

This lowers the potential barrier at the interface between the $p^-$ drift layer 63a and the n pillar layer 63b and thus allows the hall current to easily flow from the $p^-$ drift layer 63a to the n pillar layer 63b.

The width $W_A$ of the $p^-$ drift layer 63a and the width $W_D$ of the n pillar layer 63b also satisfy the formula:

$$W_A < W_D$$

In this case, $W_D$ may be adjusted as appropriate in view of voltage resistance.

The substrate material for the BiMOS semiconductor device 60 is typically, but not limited to, Si, SiC, GaN, $Ga_2O_3$ or any other semiconductor material. The impurities may be a known acceptor and a known donor.

Next, how the BiMOS semiconductor device 60 operates will be explained. It should be noted that in FIG. 14, the thick lines representing electron and hall currents indicate that the currents are large while the thin lines representing electron and hall currents indicate that the currents are small.

As shown in FIG. 14, an inversion layer 64c is generated in a portion of the n base layer 64a in the vicinity of the gate electrode 67 when a gate voltage negative with respect to the emitter/source electrode 68 is applied to the gate electrode 67 while a voltage negative with respect to the emitter/source electrode 68 is applied to the collector/drain electrode 61. In this state, a hall current 71a flows from the emitter/source electrode 68 to the collector/drain electrode 61 through the $p^+$ drain layer 62, the $p^-$ drift layer 63a, the inversion layer 64c, and the $p^+$ source layer 64b. When a base current is allowed to flow from the base electrode 69 while a voltage negative with respect to the emitter/source electrode 68 is applied to the collector/drain electrode 61, a hall current 71c flows from the $p^+$ source layer 64b to the n base layer 64a. A hall current 71d also flows from the emitter/source electrode 68 to the collector/drain electrode 61 through the $p^+$ drain layer 62, the $p^-$ drift layer 63a, the n base layer 64a, and the $p^+$ source layer 64b. An electron current 72 also flows from the $p^-$ drift layer 63a to the n base layer 64a. In this state, the hall current 71c flows into the n base layer 64a from the lower side.

In this case, since the potential barrier is low at the interface between the $p^-$ drift layer 63a and the n pillar layer 63b, a hall current 71f flows from a part of the $p^-$ drift layer 63a to another part of the $p^-$ drift layer 63a through the n pillar layer 63b.

EXPLANATION OF REFERENCE NUMERALS

10: BiMOS semiconductor device
10A: IGBT
11: Collector/drain electrode (collector electrode)
12: $n^+$ drain layer ($n^+$ collector layer)
12A: $p^+$ collector layer
13: $n^-$ drift layer
14: Composite layer
14a: p base layer (p emitter layer)
14b: $n^+$ source layer ($n^+$ emitter layer)
14c: Inversion layer
15: Trench
16: Gate insulating film
17: Gate electrode
18: Emitter/source electrode
18A: Emitter electrode
19: Base electrode
21a, 21b, 21c, 21d: Electron current
22: Hall current
30: BiMOS semiconductor device
31: Collector/drain electrode
32: $n^+$ drain layer
33: Parallel pn layer
33a: $n^-$ drift layer
33b: p pillar layer
34: Composite layer
34a: p base layer
34b: $n^+$ source layer
34c: Inversion layer
35: Trench
36: Gate insulating film
37: Gate electrode
38: Emitter/source electrode
39: Base electrode
41a, 41c, 41d, 41f: Electron current
42: Hall current 51, 52: High-resistance layer
60: BiMOS semiconductor device
61: Collector/drain electrode
62: p$^+$ drain layer
63: Parallel pn layer
63a: p$^-$ drift layer
63b: n pillar layer
64: Composite layer
64a: n base layer
64b: p$^+$ source layer
64c: Inversion layer
65: Trench
66: Gate insulating film
67: Gate electrode
68: Emitter/source electrode
69: Base electrode
71a, 71c, 71d, 71f: Hall current
72: Electron current
81, 82: High-resistance layer

What is claimed is:

1. An n-channel BiMOS semiconductor device having a trench gate structure, the n-channel BiMOS semiconductor device comprising:
 an n$^+$ drain layer;
 a parallel pn layer comprising n$^-$ drift and p pillar layers joined alternately;
 a composite layer comprising a p base layer and an n$^+$ source layer, wherein the n$^+$ drain layer, the parallel pn layer, and the composite layer are provided in order;
 a high-resistance layer provided between a portion of the p base layer above the p pillar layer and the n$^+$ source layer; and
 a high-resistance layer provided between the p pillar layer and the p base layer,
 the p pillar layer having an impurity concentration lower than that of the n$^-$ drift layer.

2. A p-channel BiMOS semiconductor device having a trench gate structure, the p-channel BiMOS semiconductor device comprising:
 a p$^+$ drain layer;
 a parallel pn layer comprising p$^-$ drift and n pillar layers joined alternately;
 a composite layer comprising an n base layer and a p$^+$ source layer, wherein the p$^+$ drain layer, the parallel pn layer, and the composite layer are provided in order;
 a high-resistance layer provided between a portion of the n base layer above the n pillar layer and the p$^+$ source layer; and
 a high-resistance layer provided between the n pillar layer and the n base layer,
 the n pillar layer having an impurity concentration lower than that of the p$^-$ drift layer.

* * * * *